United States Patent [19]

Koebke

[11] Patent Number: 5,028,873
[45] Date of Patent: Jul. 2, 1991

[54] TESTER FOR A REED RELAY PRINTED CIRCUIT BOARD

[75] Inventor: Timothy L. Koebke, San Antonio, Tex.

[73] Assignee: Southwest Research Institute, San Antonio, Tex.

[21] Appl. No.: 481,767

[22] Filed: Feb. 16, 1990

Related U.S. Application Data

[63] Continuation of Ser. No. 234,157, Aug. 19, 1988, abandoned.

[51] Int. Cl.$^5$ ............................................. G01R 31/32
[52] U.S. Cl. ................................... 324/418; 340/644
[58] Field of Search ............... 324/418, 419, 422, 423; 340/644, 640

[56] References Cited

U.S. PATENT DOCUMENTS

| | | | |
|---|---|---|---|
| 2,833,983 | 5/1958 | Shaw | 324/422 |
| 3,235,794 | 2/1966 | Henderson | 324/423 |
| 3,492,565 | 1/1970 | Harman et al. | 324/423 |
| 3,803,480 | 4/1974 | Goldbach | 324/423 |
| 3,823,366 | 7/1974 | Fabry | 324/423 |
| 4,769,596 | 9/1988 | Faucett | 324/73 PC |
| 4,845,475 | 7/1989 | Cooledge et al. | 340/644 |

OTHER PUBLICATIONS

"Testing the Sequence of Operation of Switch Contacts" J. J. Hayes Technical Digest No. 58, Apr. 1980.

Primary Examiner—Kenneth Wieder
Assistant Examiner—Maura K. Regan
Attorney, Agent, or Firm—Pravel, Gambrell, Hewitt, Kimball & Krieger

[57] ABSTRACT

The disclosure describes a tester for determining the operating condition of a Reed Relay Printed Circuit Board (PCB) device. A Reed Relay PCB to be tested is connected directly to the tester for testing in a data flow per path environment as it would be functionally connected with a data acquisition system, such as a "Ramp Scanner" model 128RR by Kaye Instruments, Inc. The tester develops accurate voltages for the test and connects them for powering components as well as for simulating data flow. As each data flow path is sequenced in its turn, the time of opening of a previous relay contact as a next contact is closed is monitored, and if it exceeds a predetermined amount of time, a visual indicator light is energized and latched in its energized state. Also, the tester includes other test circuits for testing the operating functionality of each data flow path.

9 Claims, 16 Drawing Sheets

TESTER FOR A REED RELAY PRINTED CIRCUIT BOARD

This is a continuation of co-pending application Ser. No. 07/234,157 filed on Aug. 19, 1988, abandoned.

FIELD OF THE INVENTION

The present invention, generally, relates to the testing of Reed Relay Printed Circuit Board (PCB) devices, circuits and components as sub-part of main frame data acquisition systems and, more particularly, to an apparatus and a method for testing a "Ramp Scanner" data acquisition system Reed Relay Circuit Board (PCB).

BACKGROUND

Since a Reed Relay, such as available commercially from the COTO Corporation of Providence, R.I., forms the first stage of data acquisition within a "Ramp Scanner" model 128RR mainframe system, manufactured by Kay Instruments, Inc. and since this data acquisition system provides data upon which significant decisions must be made, sometimes quickly, the importance of such a Reed Relay PCB operating correctly cannot be overemphasized. In nuclear critical situations, these Reed Relay PCBs are subjected to periodic functional inspections, and if necessary, they are re-calibrated and/or re-certified.

It can be a chilling thought to realize that even though the mainframe section of a "Ramp Scanner" or similar data acquisition system can remain within calibration indefinitely, the data presented to a "Ramp Scanner" or similar mainframe system can be altered by a malfunctioning Reed Relay PCB. The danger this creates is multiplied when such malfunctioning is intermittent and, as it can be so easily, undetectable by present-day tests.

DESCRIPTION OF THE PRIOR ART

The prior art is rich with many forms of testing systems and devices to detect whether the contacts of switches, solenoids, etc., are operating by opening and closing as required to perform various functions. For example, there are testers to detect when the contacts of a switch or solenoid fail to close; fail to close after opening properly; open too soon; or open too late.

Uses in the prior art that depend upon properly operating switches and solenoids with contacts to open and close in a timed relationship include print hammers in high speed printers; cart sorting equipment with diverter gates that are switch contact operated; and record card feeding apparatus that use contact-operated card handlers. Depending upon a particular type of environment in which the switch or solenoid is used, the first indication of a failure occurs when, for example, characters that were to be printed are missing or are printed out of alignment; when card sorting equipment are discovered to be sorting improperly; and when record card feeders fail to feed properly or jam or otherwise damage the cards.

These failures involve cost and expenses to repair, and they are inconvenient. Otherwise, they are relatively harmless when compared with results flowing from incorrect data and other information. Such results can stagger the imagination and can cover a wide range from loss of fortunes to loss of life. Many aspects of the significance of this point will be understood more fully from the detailed description of the present invention to follow. Meanwhile, a brief review of some of the more pertinent prior patented art may be helpful. In U.S. Pat. No. 3,803,480 to Goldbach, a specialized device is disclosed for measuring time intervals between opening and closing contacts in a switch. The measuring device of Goldbach has an oscillator to generate signals of a desired frequency that are connected to the contacts of the switch under test. A comparator circuit compares the frequencies through each contact of the switch with reference signals for determining whether any of the contacts in the switch bounce during a change in state. As will be understood better as the description of the present invention proceeds, the use of an oscillator and comparator devices to perform a test of a reed relay is far too inaccurate and otherwise completely inconsistent to determine operating characteristics performed by a reed relay when it is functioning as the first stage of a data acquisition system.

U.S. Pat. No. 3,988,664 to Beery et al. discloses a particular system to detect a fault in a solenoid, which system includes a current-sensing resistor with a differential voltage comparator to sense the waveform of the current flow. The differential voltage comparator is of unique specifications that are described, but they are to make it responsive to changes in polarity of the signal which is indicative of the condition of the solenoid being tested. This, again, is a particular system for a very specific purpose, and the principles that this system uses are not nearly sufficiently accurate to be effective in testing a reed relay printed circuit board.

Clearly, there is a need for a way to indicate whether a Reed Relay PCB is operating correctly and consistently, particularly when such a device is used in an environment such as a "Ramp Scanner" data acquisition system. Moreover, there is a need for such a way of making this determination with a minimum of training.

SUMMARY OF THE INVENTION

Accordingly, it is a principal object of the present invention to provide a new and improved method and means of giving an indication of the operating characteristics of a Reed Relay PCB.

Another important object of the invention is to provide a way of determining whether a Reed Relay PCB is operating correctly.

A further object of the invention is to provide a way of testing the operating condition of a Reed Relay PCB in a "Ramp Scanner" data acquisition system type of environment.

A still further object of the present invention is to provide a testing means and method for determining quickly whether a Reed Relay PCB is likely to be in condition to operate correctly and consistently.

Briefly, a tester in accordance with the present invention includes circuitry to indicate to an operator having a minimum of training whether the Reed Relay PCB is functioning correctly. A plurality of signal means give an indication of the operating condition of the Reed Relay PCB in different modes of operations and, when a malfunction is indicated, which aspect of the Reed Relay PCB is suspect.

A presently preferred form of the tester of the invention provides a plurality of visual indicators in groups, one group of visual indicators for each test to be performed and each visual indicator in each plurality will give an indication of the functioning condition of different aspects of the Reed Relay PCB. For example, one visual indicator tells an operator the condition of each of two paths in a Reed Relay PCB. A plurality of visual indicators give the operating status of each configuration switch in the Reed Relay PCB, to be described in more detail hereinafter.

Another plurality of visual indicators give the operating status of each data flow channel, including both data paths in each channel, in a Reed Relay PCB being tested. As each channel is enabled sequentially at variable data flow rates, a visual indicator tells an operator whether that channel has proper data flow.

One of the more important tests that the tester of the invention is adapted to perform is to give a visual indication when an electrical contact in a Reed Relay PCB being tested exceeds a predetermined period of time in releasing contact. A reason that this is important is that as little as one such occurrence over hours of continuous operations is indicative of a Reed Relay PCB that is inconsistent and unreliable, particularly in the above-described operating environment.

The above, other and further objects, features and advantages of a Reed Relay PCB tester according to the invention will be understood better from the following detailed description of the presently preferred embodiment, which is described in conjunction with the accompanying drawings.

DETAILED DESCRIPTION OF THE PREFERRED EMBODIMENT

Figure 1:
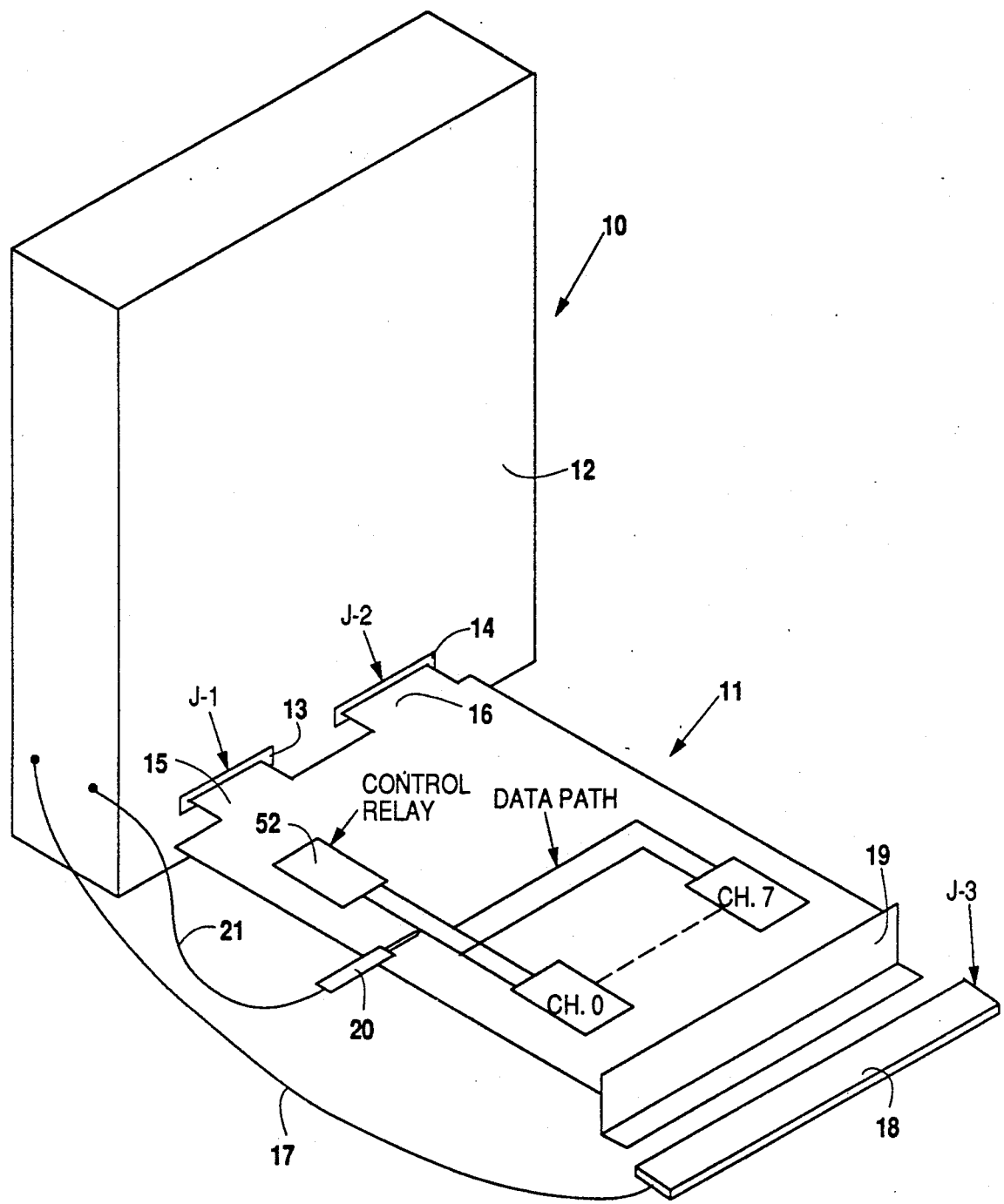
FIG. 1 is a view of the tester of the invention with a Reed Relay PCB in position to be checked.

In the following detailed description, the same reference numerals are used to identify the same or comparable component parts in the various figures.

In FIG. 1, the numeral 10 identifies the tester of the present invention, and the numeral 11 identifies a Reed Relay Printed Circuit Board (PCB) positioned for testing by the tester 10. A front panel 12 of the tester 10 is in a substantially vertical position and has an opening 13, that is identified also by a legend J-1, and an opening 14, identified also by a legend J-2.

A normal Reed Relay Printed Circuit Board (PCB) 11 requires a third connector, and this is provided by a multi-conductor cable 17 with a spade lug attachment 18 at one end, the opposite end being connected to the circuitry within the tester 10 as will be described in detail presently. The spade lug attachment 18 is identified also by the legend J-3 and is adapted to be attached readily to a multiscrew terminal 19 on the reed relay PCB 11. A spade lug is a specific type of split terminal connector that is known in the industry.

Also shown in this FIG. 1 of the drawings is a test probe 20 that is attached at one end of a single conductor lead 21. The opposite end of the lead 21 is attached to circuitry within the tester 10, as will be described in more detail hereinafter.

Figure 2:
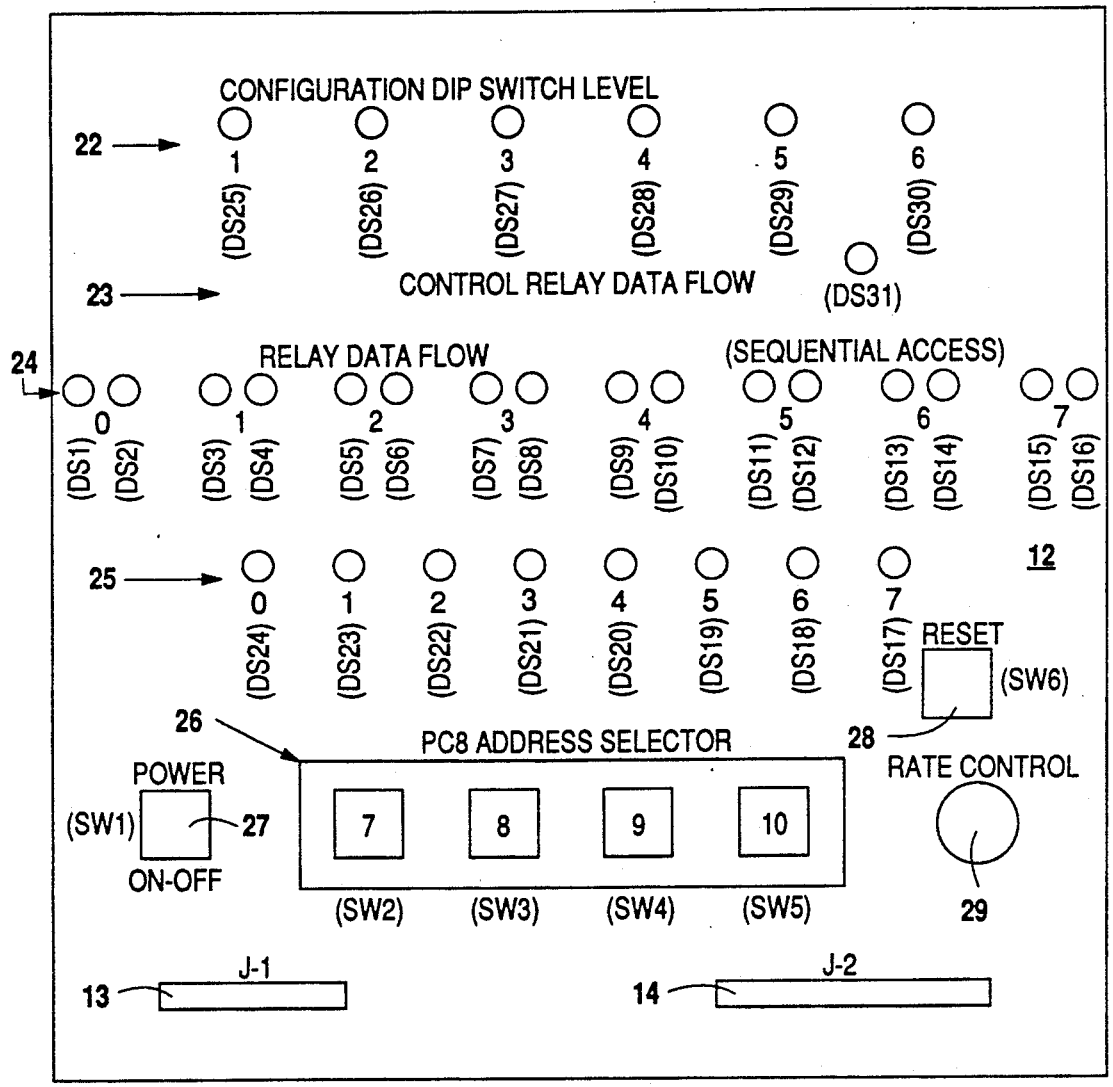
FIG. 2 is a view of the vertical front panel of the tester of FIG. 1.

See FIG. 2 for a more complete view of the front panel 12 of the tester 10. The front panel 12 is at a predetermined angle with the horizontal, the preferred angle being 90 degrees, but the particular angle is only a matter of preference. There are four groups of visual indicator lights that are identified, respectively, by the numeral 22, 23, 24 and 25. The pattern or the arrangement of the visual indicator lights is also a matter of preference.

The group 22 at the top of the panel 12 is indicative of the functionality of the DIP switches, as will be described in more detail presently, and the single visual indicator light in the second group 23 is indicative of the condition of the two data paths in a Reed Relay PCB.

The group 24, in the preferred arrangement, consists of eight pairs of visual indicator lights, one pair for each data channel in the relay, or since there are two data paths per channel, one visual indicator light for each data path in the relay circuit. Since the tester circuit selects each channel sequentially, as will be described in detail, one pair of these visual indicator lights will give an indication of data flow in sequence at a predetermined rate.

The fourth group 25 of visual indicator lights will give an operator an indication that at least one relay contact exceeded a preset period of time for it to remain in contact to be termed as operating properly. This is a significant test because it reveals a condition which can affect the quality of the data. The tester that operates in accordance with the principles of the present invention classifies a contact release time that is in excess of approximately 1 millisecond as a "Race Condition".

A "Race Condition" should never occur, but if it does, it is indicative of contact instability, a dangerous condition in the particular environment in which a Reed Relay PCB absolutely must be depended upon for operational stability. According to the specifications for these reed relays by the manufacturer, contact release time is specified as typically 100 microseconds, and therefore, the tester 10 of the invention is set to indicate a contact release time exceeding 1 millisecond as being a "Race Condition", indicating the existence of a contact release delay at least 10 times greater than typical.

Also shown on the front panel 12 in FIG. 2 are four toggle switches identified generally by the reference numeral 26. The toggle switches 26 also are identified by the legend "PCB ADDRESS SELECTOR" and will be described in more detail in connection with the tester circuit.

A power on-off switch 27 and a reset switch 28 are shown on the front panel 12 and will be identified further hereinafter. Likewise, a "rate control" adjustment knob 29 is shown on the front panel 12, and at the bottom of the front panel 12, the two edge connector openings 13 and 14 are visible with their respective legends J-1 and J-2.

The Power Circuit

Figure 3:
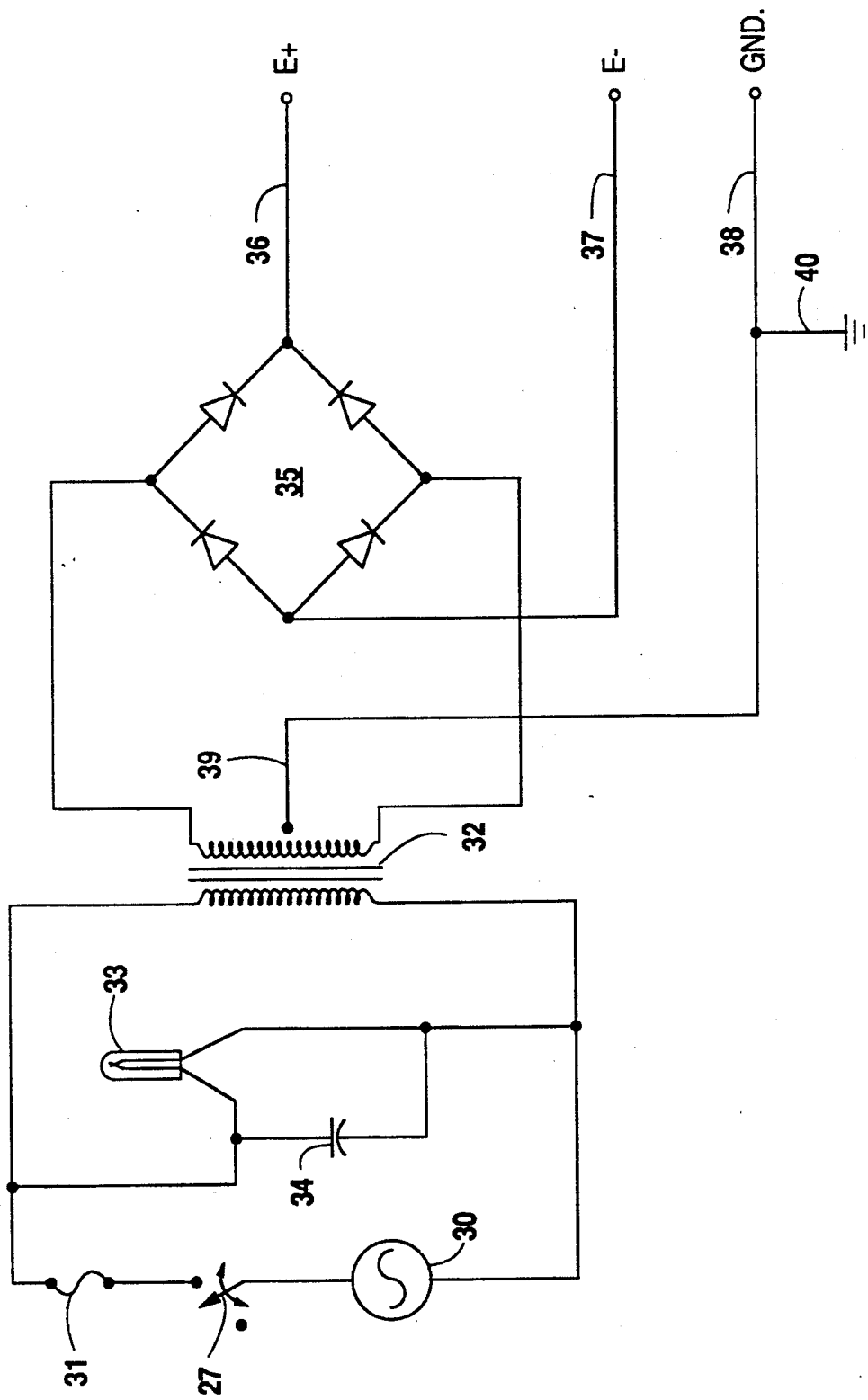
FIG. 3 illustrates details of the source of electric power for use in testing a reed relay PCB.

FIG. 3 of the drawing illustrates a circuit to begin the development of electric power for the tester 10 to realize its effectiveness in uncovering defective and potentially defective Reed Relay PCBs. The on-off power switch 27, shown on the front panel 12 in FIG. 2, is shown here in series with a source 30 of 110 volts a-c, a 2 amp fuse and the primary winding of a transformer 32, identified more particularly as a 25.2 VCT transformer.

A light 33 that is a NE-1 (TE-neon) bulb is connected in parallel across the primary winding of the transformer 32 so that the on-off switch 27 can be illuminated when the power is turned "on", and a 0.1 microfarad capacitor 34 is connected across the light 33 to serve as a starter. The secondary winding of the transformer 32 is connected directly to a rectifier 35 that is formed of four 1N2071 diodes to provide at terminals 36 and 37, respectively, +E and −E. A ground terminal 38 is obtained from the center tap 39 of the transformer 32, which is connected to the chassis of the tester 10 at 40.

Figure 4:
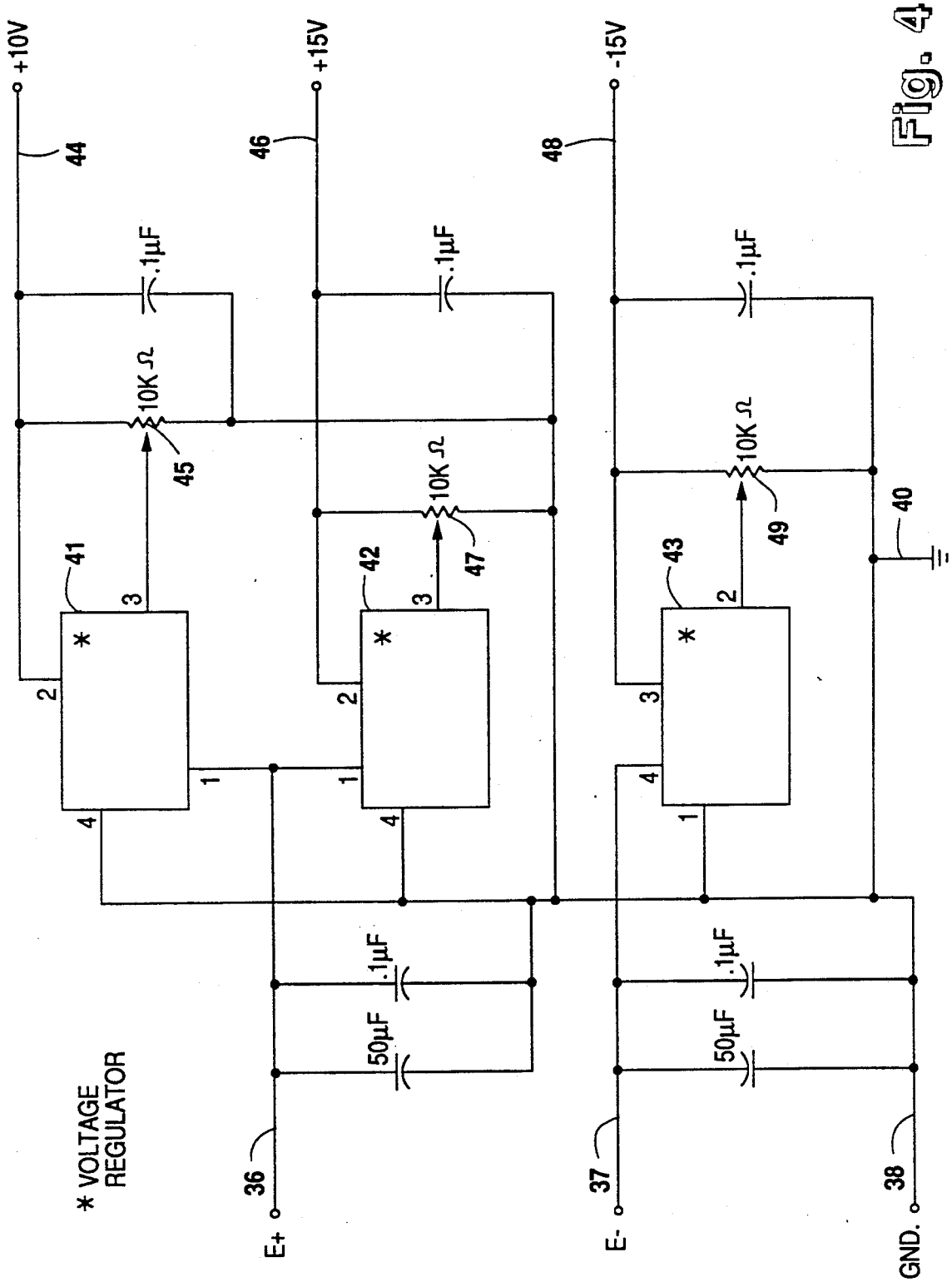
FIG. 4 illustrates the refinements necessary to the power source of FIG. 3 to achieve the accuracy that is in accordance with the principles of the invention.

In FIG. 4 of the drawings, a circuit arrangement is illustrated to refine the voltages +E and −E, above ground, in order to obtain the accuracy needed. For example, the +E at the terminal 36 is connected directly to input No. 1 of respective voltage regulator circuits 41 and 42, which are 500 ma Fairchild, type 78 MG, and the ground terminal 38 is connected to input No. 4 of each voltage regulator 41 and 42.

The −E at the terminal 37 is connected directly to input No. 4 of a voltage regulator circuit 43, which is a 500 ma Fairchild, type 79 MG, and the ground terminal 38 is connected to input No. 1. Between each of the voltage terminals 36 and 37 and ground 50.1 microfarads of capacitance is connected as a part of the refinement process for these voltages.

The output of the voltage regulator circuit 41 is obtained from terminal No. 2 and is connected to a terminal 44. By means of a 10,000 Ohm potentiometer 45, with a 0.1 microfarad capacitor connected across it and with its variable contact connected to output terminal No. 3, the magnitude of the voltage at the terminal 44 is adjusted with the needed accuracy, indicated as +10 volts.

Similarly, the output of the voltage regulator circuit 42 is obtained from terminal No. 2 and is connected to a terminal 46. By means of a 10,000 Ohm potentiometer 47, with a 0.1 microfarad capacitor connected across it and with its variable contact connected to output terminal No. 3, the magnitude of the voltage at the terminal 46 is adjusted with the needed accuracy, indicated as +15 volts.

The output of the voltage regulator circuit 43 is obtained from terminal No. 3 and is connected to a terminal 48. With a similar 10,000 Ohm potentiometer with a 0.1 microfarad capacitor connected across it and with its variable contact connected to output terminal No. 2, the magnitude of the voltage at terminal 48 is adjusted with the needed accuracy, indicated as −15 volts. In each of these voltages at the terminals 44, 46 and 48, the voltage is measured with respect to the Ground of the power supply at 40.

The RESET Function

Figure 5:
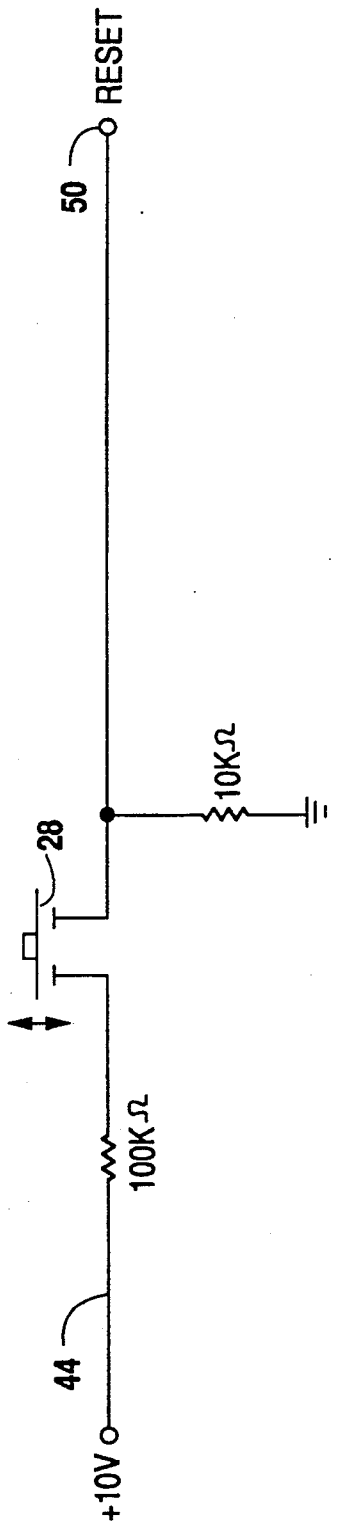
FIG. 5 is indicative of a preferred way of achieving a needed reset function for the tester of the invention.

FIG. 5 illustrates in a slightly oversimplified manner how the "Reset" switch 28 (momentary contact/normally open), FIG. 2, fits in an operative way in order to accomplish its purpose in the tester circuit of the invention. For example, as viewed in FIG. 5, the "Reset" switch 28 is connected on one side, through a current-limiting, 100,000 Ohm resistor, to the +10 volt terminal 44, and on the opposite side, to a "Reset" terminal 50. On the terminal 50 side of the switch 28, there is a 10,000 Ohm resistor between the "Reset" terminal 50 and ground to smooth any tendency of the switch 28 to develop voltage spikes as it is actuated.

The "Reset" switch 28 is needed because the tester 10 provides for the visual indicator lights, group 25 in FIG. 2, to remain "on" once one of them is energized, and therefore, the "Reset" switch 28 is to restore the lights in the group 25 of an "off" state. This function will be described in more detail in connection with that test.

The Electrical Distribution

Figure 6:
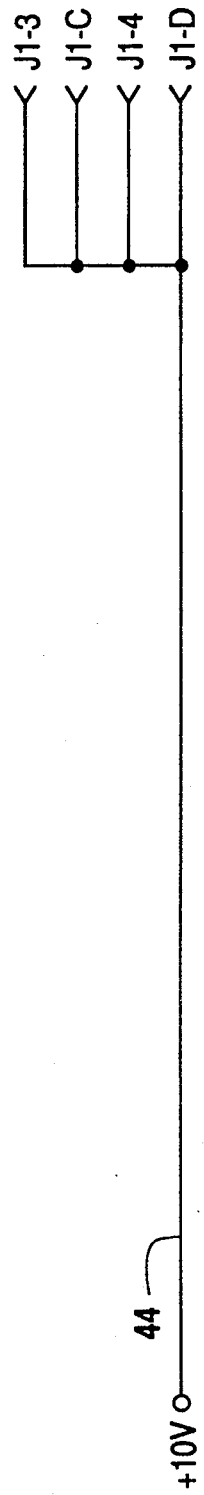
FIG. 6 is an illustration of a connection for applying an accurate voltage from the power source of FIG. 3 as refined by the arrangement of FIG. 4 to a Reed Relay PCB being checked.

FIG. 6 illustrates that the electrical voltage that is generated at the terminal 44 is connected to certain terminals on the J-1 edge connector within the opening 13, FIG. 1, where it is connected to a reed relay PCB 11 by way of a terminal 15, also FIG. 1. In a typical reed relay PCB, and J-1 terminal is a 12 pin edge-type connector.

Figure 7:
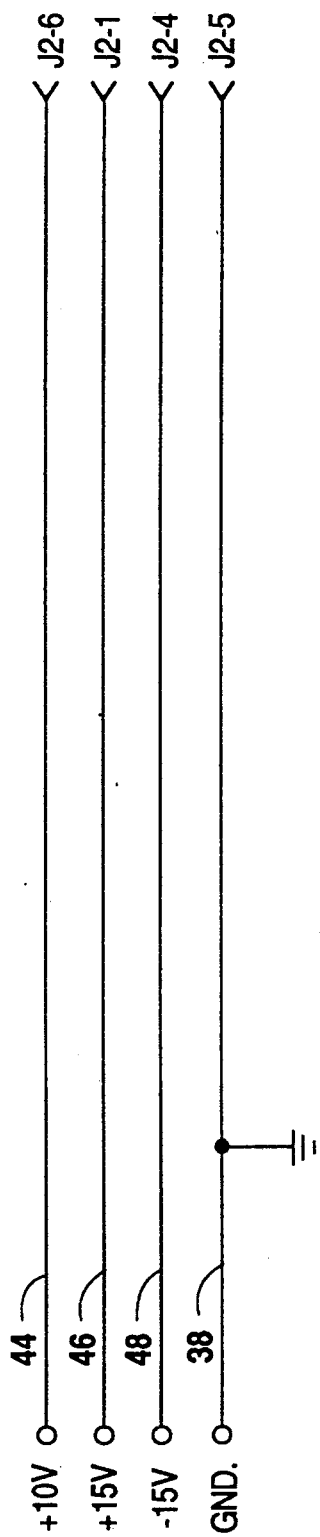
FIG. 7 is a further extension of the connection of these accurately developed electrical voltages to particular input connections of a Reed Relay PCB.

FIG. 7 illustrates that the various electrical voltages described above in conjunction with FIG. 4 are connected to certain terminals on the J-2 edge connector within the opening 14, FIG. 1, where these voltages are connected to a Reed Relay PCB 11 through the terminal 16.

The Control Relay Data Flow Test

Figure 8:
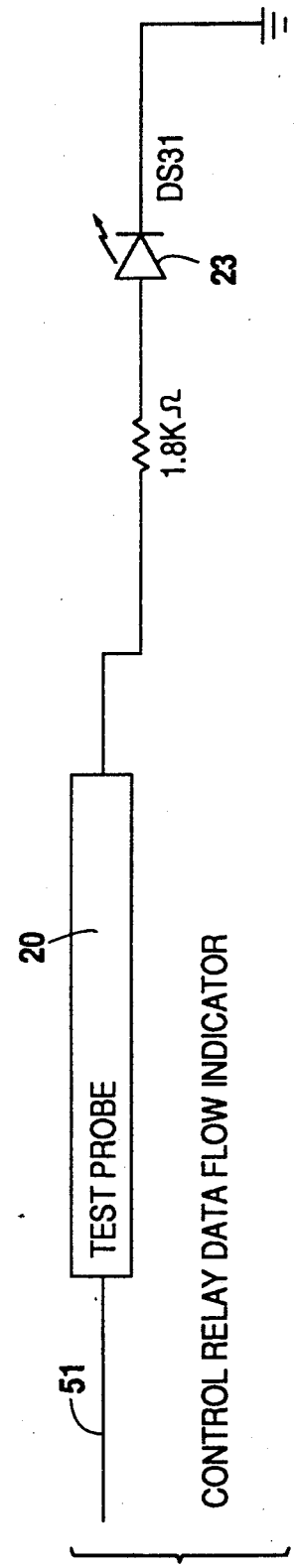
FIG. 8 shows a preferred circuit to obtain one of the tests in accordance with the invention.

In FIG. 8, the test probe 20 is shown again that was identified first in conjunction with FIG. 1, and here, its electrical connections are shown. The test probe 20 has a point 51 that is part of the electrical conductor that passes through the handle of the test probe 20 to an 1800 Ohm current limiting resistor which is in series with the single visual indicator light 23, also shown in FIG. 2.

For this test, the point 51 of the test probe 20 is placed in contact with one of the two data paths from the control relay 52, shown diagrammatically in FIG. 1. The soldermask, if there is any, must be pierced to make the contact. When contact is made, the light 23 should be illuminated, and while so lit, move any one of the PCB ADDRESS SELECTOR switches 26 to its opposite position, assuming that these switches 26 have been present correctly as described in the next test hereinafter.

When one of the switches in the group 26 is positioned as described above, the light 23 should turn "off". If it does, the particular switch in the group 26 that was moved should be returned to its original position, and the above test may now be repeated for the other data flow path.

If a different visual indicator response is obtained, the control relay 52 should be replaced, and this test should be repeated with the new control relay. Should the same results be obtained again, a defective data flow path is at fault, either a short or an open circuit.

Configuration DIP Switch Level Test

The PCB ADDRESS SELECTOR switches 26 on the tester front panel 12, FIG. 2, should be configured to match the DIP switch address for the particular Reed Relay PCB 11 being tested. If the switches 26 are set correctly, the data input channels will be accessed continuously in sequence and the visual indicator lights in the group 22 on the tester front panel 12 will be illuminated in a like manner.

Figure 9:
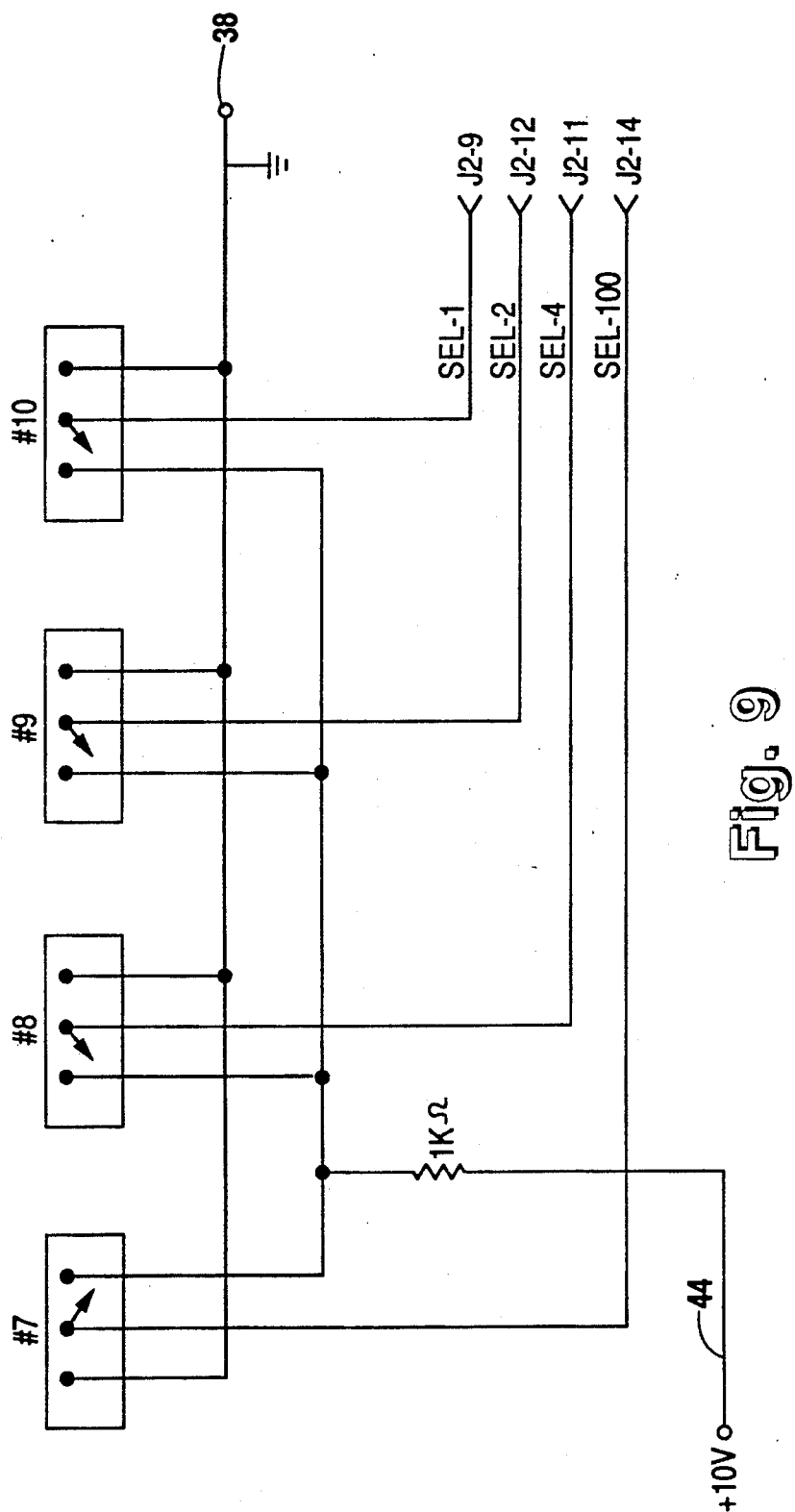
FIG. 9 illustrates the interconnection of a plurality of switches in order to achieve one of the tests according to the invention.

FIG. 9 of the drawings shows the electrical connections for the switches 26, which also have the legends 7, 8, 9 and 10 in FIG. 2. The accurately adjusted +10 volts of the terminal 44 is connected, through a 1000 Ohm current limiting resistor, to the left terminal for the switches 8, 9 and 10, while to the right terminal for the switch 7. This is due to a polarity reversal within a typical Reed Relay PCB, but the circuit function is the same as for the other switches. Therefore, to avoid confusion on the tester front panel 12, these connection reversals are made behind the panel.

The center terminal for each of the switches 26 is connected to the edge connector J-2 for being energized from the Reed Relay PCB 11 under test through the terminal 15. The remaining terminal for each of the switches 7, 8, 9 and 10 is connected to ground, as by the terminal 38 that was described above in conjunction with FIG. 3.

Figure 10:
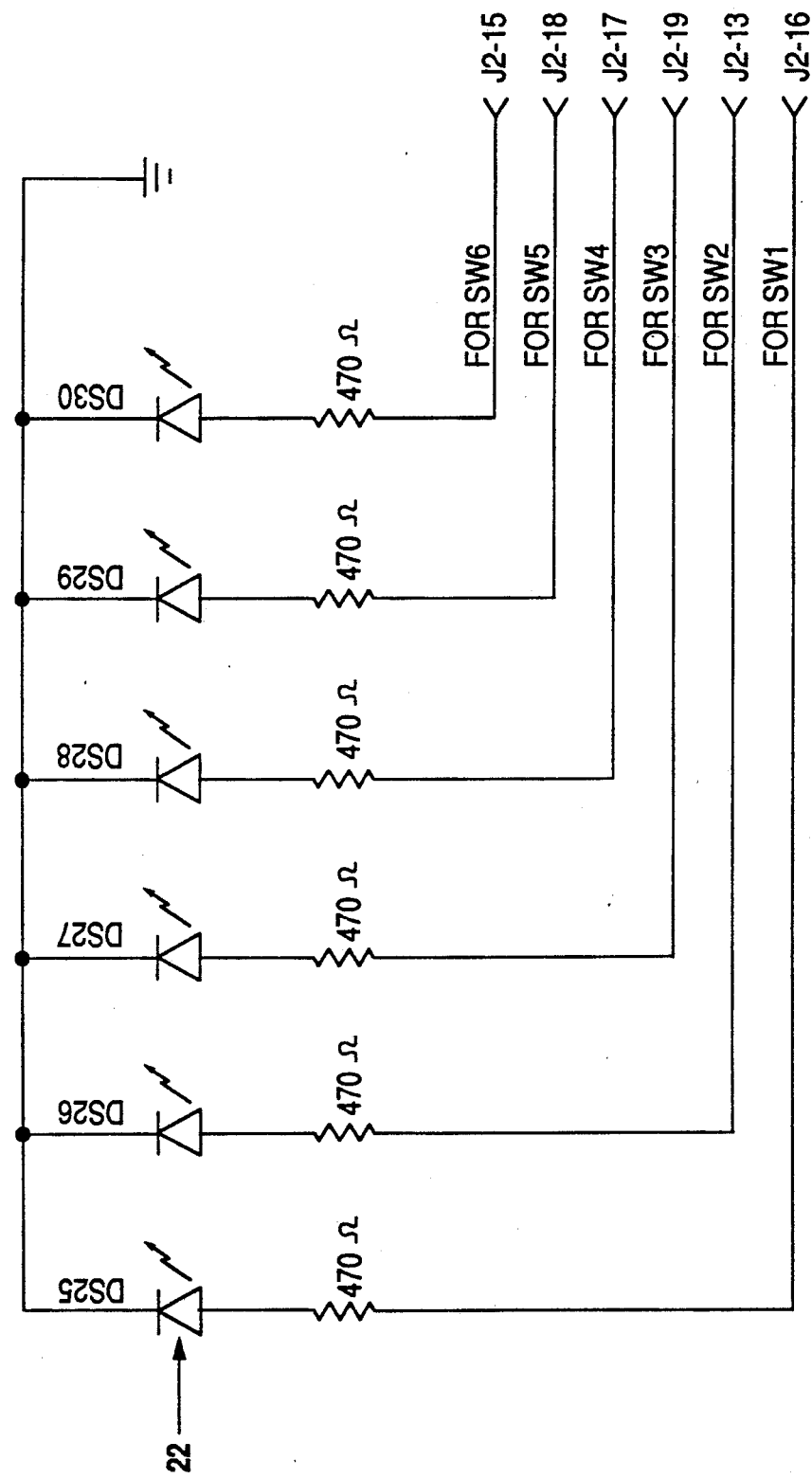
FIG. 10 is a circuit to energize a plurality of visual indicators through connections to certain terminals of a Reed Relay PCB being checked.

The visual indicator lights in the group 22 are connected to the Reed Relay PCB under test as shown in FIG. 10 of the drawings. A 470 Ohm current limiting resistor is connected in series with each of the lights in the group 22, and the particular terminal in the edge connector within the opening 14, FIG. 1, is identified in this FIG. 10.

To test the configuration DIP switches on the Reed Relay PCB as to their being operative, once the PCB address switches 26 are confirmed as matching the settings on the DIP PCB address switches, each remaining configuration DIP switch is turned "on". The corresponding light in the group 22 should illuminate, and when each switch, in turn, is turned "off", the corresponding light in the group 22 should turn "off". Otherwise, corrective action should be taken. This test confirms the functionality of configuration DIP switches on Kaye Instruments, Inc. Reed Relay PCB.

Relay Data Flow (Sequential Access) Test

From the moment that a Reed Relay PCB is connected to the tester 10 of the present invention, electrical voltage representative of data flow signals is applied continuously to all external data paths in all of the several data flow channels. Therefore, as part of the description of this test, reference is made to FIG. 11 of the drawings.

Figure 11:
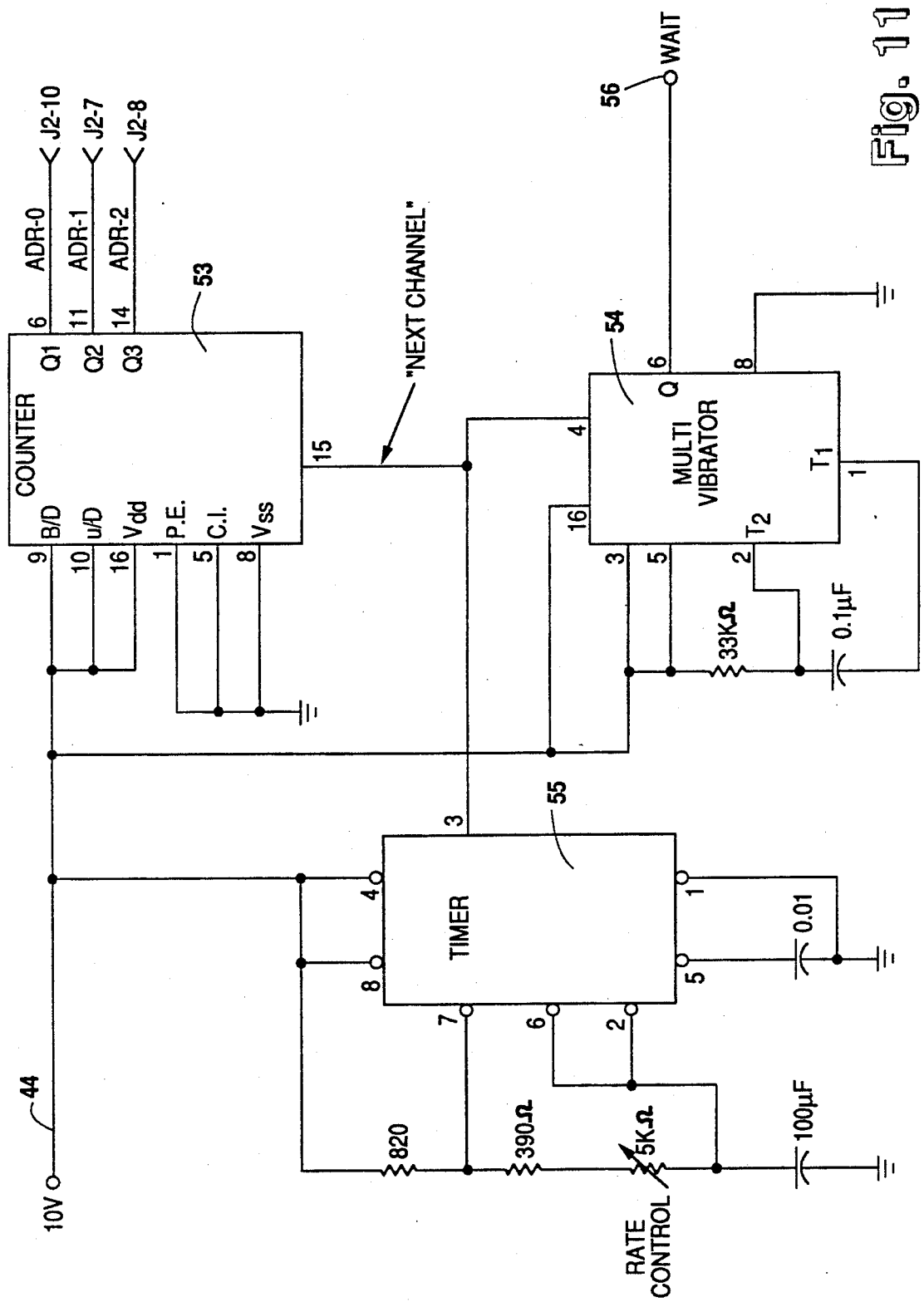
FIG. 11 is illustrative of a preferred circuit arrangement to obtain some of the more significant features in accordance with the present invention.

In FIG. 11, there is illustrated a circuit to achieve a needed data flow simulation sequentially for the respective internal data flow paths. In this circuit, all passive circuit components are defined clearly and values are given. The respective operative components will be identified further hereinafter.

The accurate +10 volts that is developed by the circuit in FIG. 4 is connect to the terminal 44 herein and is connected directly to terminals 9, 10 and 16 of a binary decade up-down counter 53, type CD4029, and to terminals 3, 5 and 16 of a dual monostable multivibrator 54, type CD4528, and to terminals 4 and 8 of a clock timer 55. For the timer 55, a total of 5390 Ohms of resistance is connected between its terminals 7 and 2–6 of which most is variable to function as a "Rate Control" with the movable contact adjustable by the knob 29 on the tester front panel 12, FIG. 2.

The rate of the timer 55, therefore, is adjusted by the rate control knob 29, and its output signal from its terminal 3 is connected to input terminal 15 of the counter 53 in order to control the rate of selection of the data paths sequentially. The output from the counter 53 at its terminals 6, 11 and 14 is connected to the input of a Reed Relay PCB 11 through the J-2 edge connector of the tester 10.

Also, the output of the timer 55 from its terminal 3 is connected to input terminal 4 of the multivibrator 54. The output of the one-shot monostable multivibrator 54, at its terminal 6, develops a signal at connector terminal 56 that is used as a "WAIT" signal and will be described more fully hereinafter.

Figure 12:
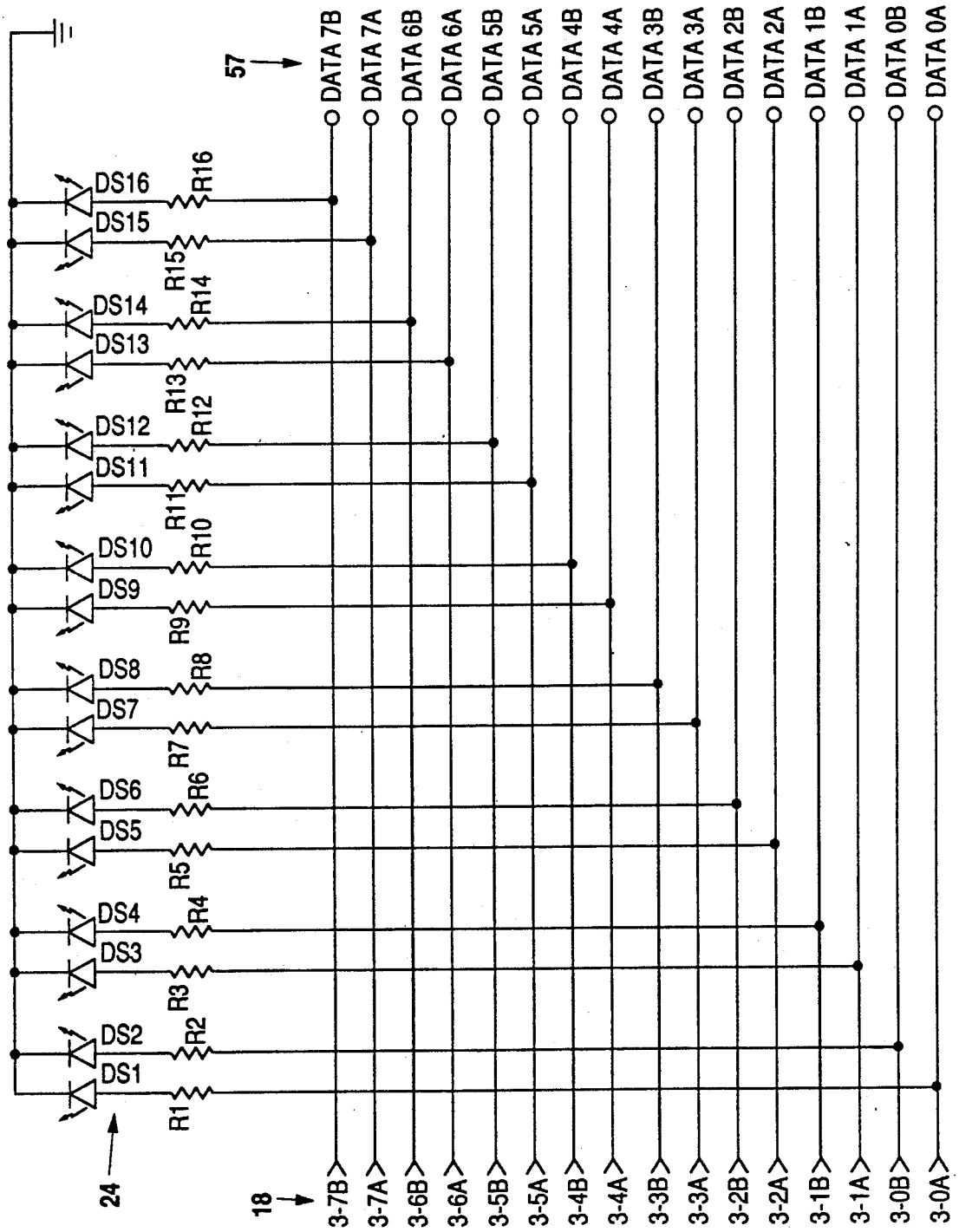
FIG. 12 is a circuit to energize a plurality of visual indicators as an aid in describing the invention.

With the voltage input to a Reed Relay PCB 11 under test as described above, a current flow is developed in the Reed Relay PCB data paths that simulates data flow, and its output is obtained at the spade lug attachment 18 FIG. 12, which is also illustrated in FIG. 2. From each of the 16 data output terminals at the spade lug attachment 18, a connection is made to one of the visual indicator lights in the group 24 FIG. 12, also illustrated on the tester front panel 12, FIG. 2.

There are eight (8) data channels in a Reed Relay PCB applicable to a Kaye Instruments Inc. "Ramp Scanner" model 128RR, and each data channel has two (2) individual and separate data paths. Therefore, the 16 data paths are accessed in pairs in sequence continuously during a test procedure. A correct presetting of the PCB ADDRESS SELECTOR switches 26 to match the dip switch address setting on a Reed Relay PCB under test will enable a correct sequencing of the visual indicator lights in the group 24.

As each data channel is accessed (or enabled) in this sequence, the corresponding pair of visual indicator lights are illuminated, which gives a visual indication of whether there is proper data flow. By adjustment of the rate control knob 29, the sequential access to each data channel can be as fast as about 8 channels per second or as slow as approximately 1 channel per second. This will be described still further hereinafter.

During this test, as each data channel is enabled automatically in sequence, it can be observed whether both indicators for a channel turn "off" as the pair of indicators for the next channel are turned "on", and this is done at various rates. A malfunction is indicated when any light is "on" other than for the channel being accessed or when any light is "off" permanently (assuming the bulb tests "good"). By this test, a malfunctioning relay contact or a problem with a data flow path is identified and is isolated.

Relay Race Condition Test

As described above, a "Race Condition" is defined as when there is excessive relay contact release time, which should never occur, but if it does, it indicates some degree of relay contact instability. Therefore, such a "Race Condition" is indicative of a definite component malfunction, which can lead to the development of erroneous data.

As each data channel is enabled, as described above, the relay contact release time for the previously accessed relay contact is monitored. If such relay contact release time ever exceeds a specific period, that event is "latched" activating the corresponding visual indicator light until it is "Reset" manually.

The manufacturer's specification for the Reed Relay herein referenced specifies contact release time as typically 100 microseconds, and the tester 10 of the present invention identifies a "Race Condition" as a contact release time in excess of approximately 1 millisecond. A relay contact release time of approximately 1 millisecond indicates a delay in the release of a contact at least 10 times greater than typical. A condition such as this, whether intermittent or continuous, can produce errors in data, and it can go undetected for an indefinite period of time.

FIG. 12 shows the source of the signals to perform this test as was used in the test above. The same spade lug attachment 18 that provided the voltage signals for the sequential access test lights 24 has connections to comparable terminals identified generally by the reference numeral 57.

Figure 13:
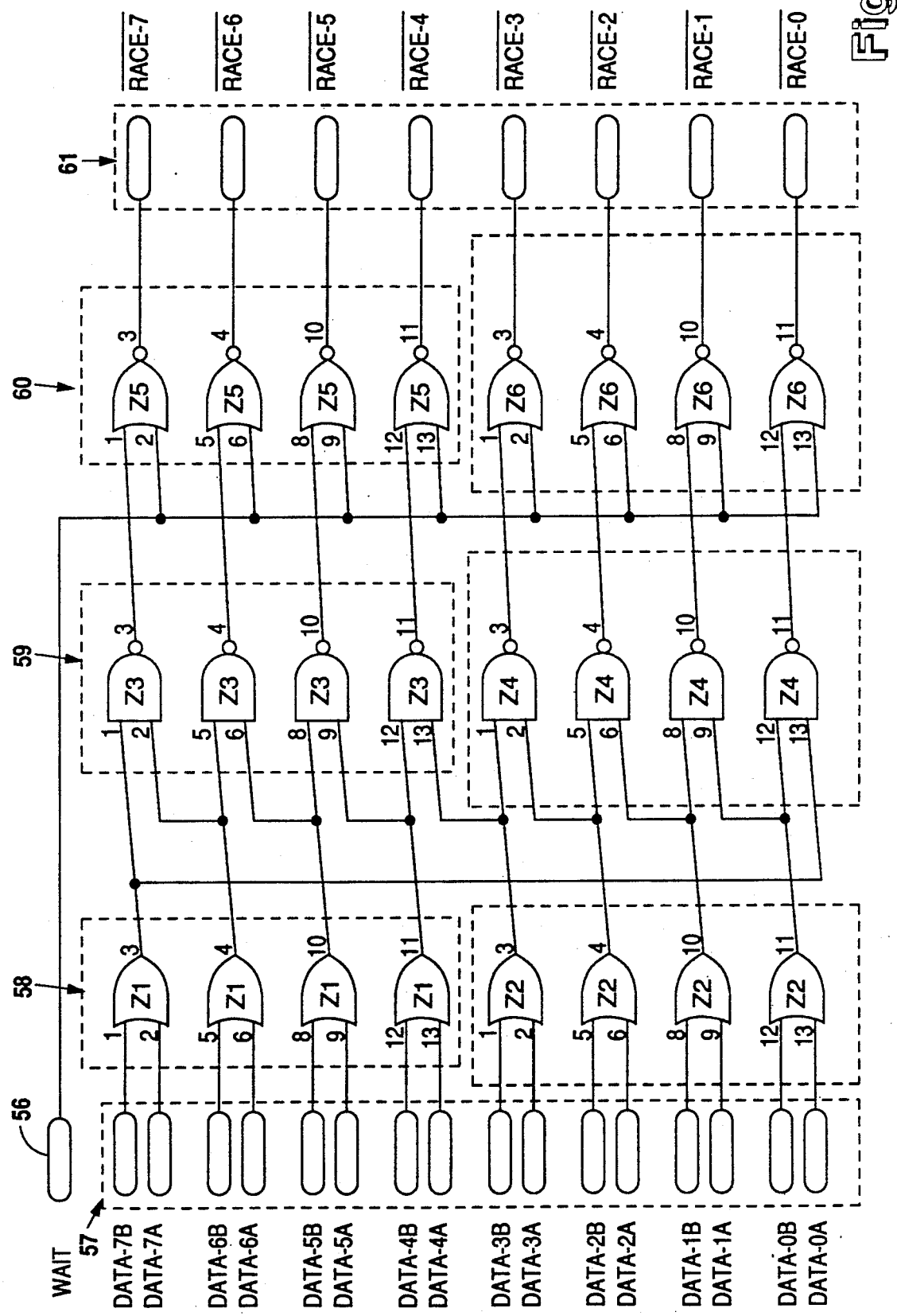
FIG. 13 and FIG. 14 illustrate the interconnection of a plurality of particular component parts to achieve an important aspect of the invention.

FIG. 13 shows the connections from the plurality of terminals 57, each pair to a plurality of OR gates 58, the outputs of which provide one of the inputs to each of a plurality of NAND gates 59, the second input being the previous channel output, and finally, the output of the NAND gates 59 being one input to a plurality of NOR gates 60, the second input being the "Wait" voltage signal on the terminal 56, FIG. 11. The purpose of the circuit illustrated in FIG. 13 is to identify a "Race Condition", and it is believed that such purpose will become clear to one skilled in the art with the interconnection of the particular component parts as illustrated in this view.

Figure 14:
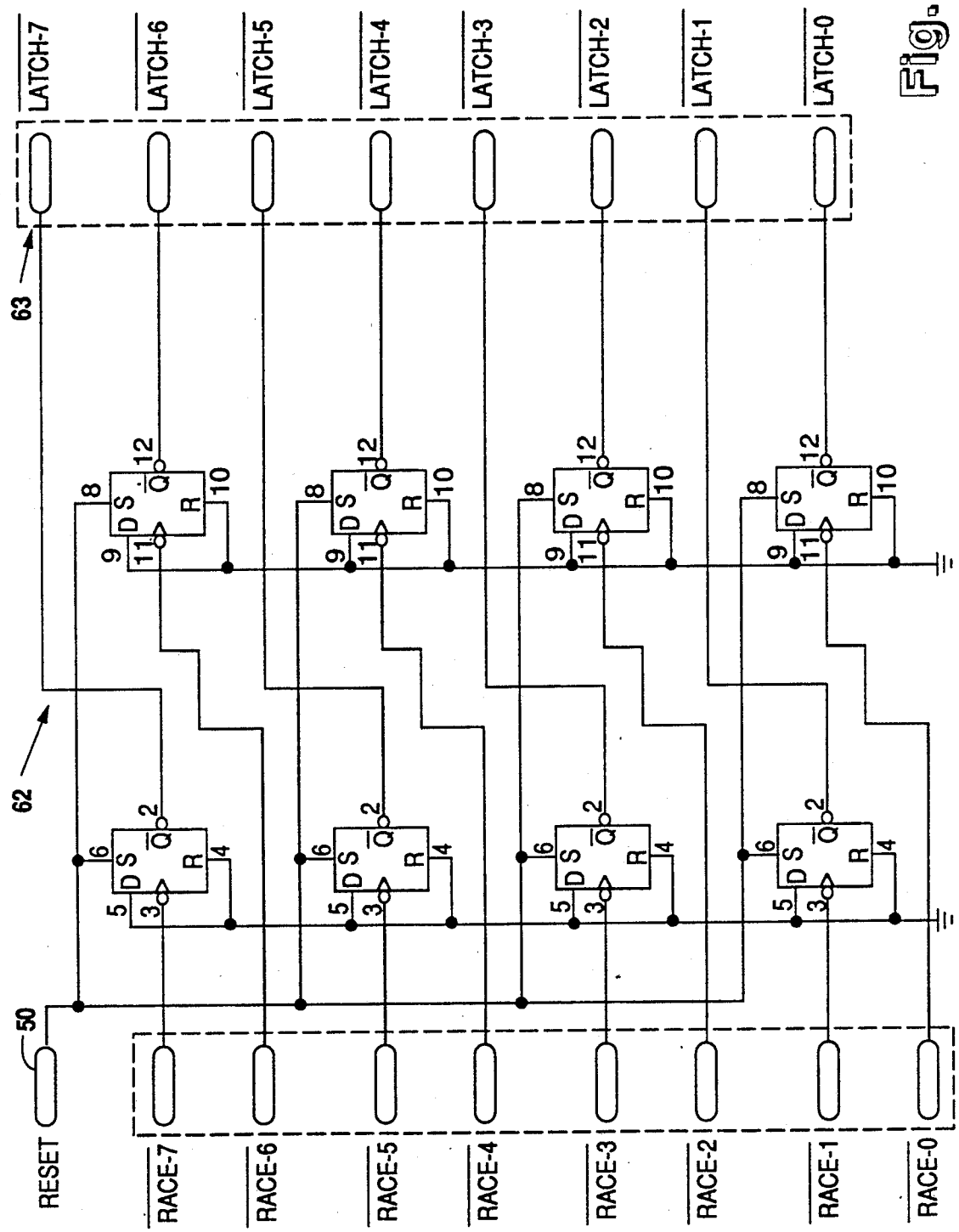

Having identified a "Race Condition" in FIG. 13, the interconnection of the particular component parts shown in FIG. 14 will "latch", and thereby save, the identity of the data path that produced that fault. When the data path that produced the "Race Condition" fault is identified by having a voltage output signal appear on one of the terminals 61, FIG. 13, even momentarily, after the adjacent terminal is energized, such a voltage signal will cause its corresponding dual D flip-flop circuit 62, FIG. 14, to change states and complete an electrical connection from its terminal 2 or 12 to ground.

FIG. 14, therefore, illustrates the circuit by means of which a "Race Condition" fault, even though momentary, is "latched" and preserved until it is "Reset" manually. At the origination of this test procedure, the circuit is "Reset" by means of the Reset switch 28, FIG. 2 and FIG. 5. This applies the +10 volts to reset all of the flip-flop in the plurality 62 which closes the electrical connection to ground, where it remains until the Reset switch 28 is closed manually again.

Figure 15:
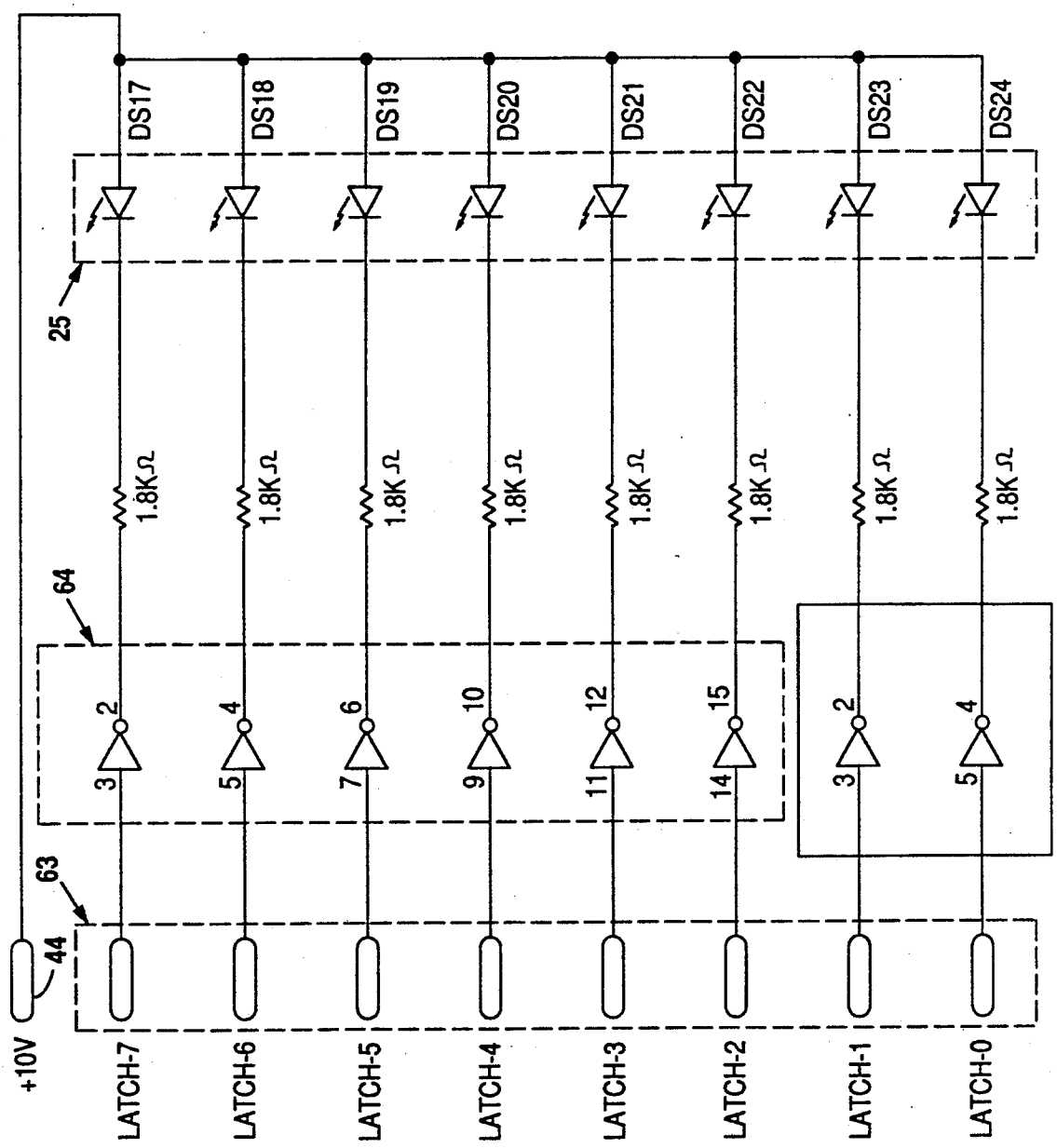
FIG. 15 shows the details for connecting a plurality of visual indicators in accordance with one of the test functions obtained by the tester of the invention.

In FIG. 15, a plurality of hex inverting buffers 64 are connected in series with respective 1800 Ohm limiting resistors for each of the visual indicator lights in the group 25, FIG. 2. Now, it can be seen that the circuit is complete when a flip-flop in the plurality 62 in FIG. 14 is "set" by even a momentary signal on its respective terminal 61 connecting its corresponding terminal 63 to ground to complete an electrical circuit through this terminal 63, FIG. 15, through one of the hex inverting buffers 64 and its light 25 to the +10 volts at the terminals 44.

With the tester 10 of the present invention, a Reed Relay Printed Circuit Board (PCB) can be tested quickly, easily and reliably. This has not been possible until now without use of elaborate and expensive specialized test equipment.

Figure 16:
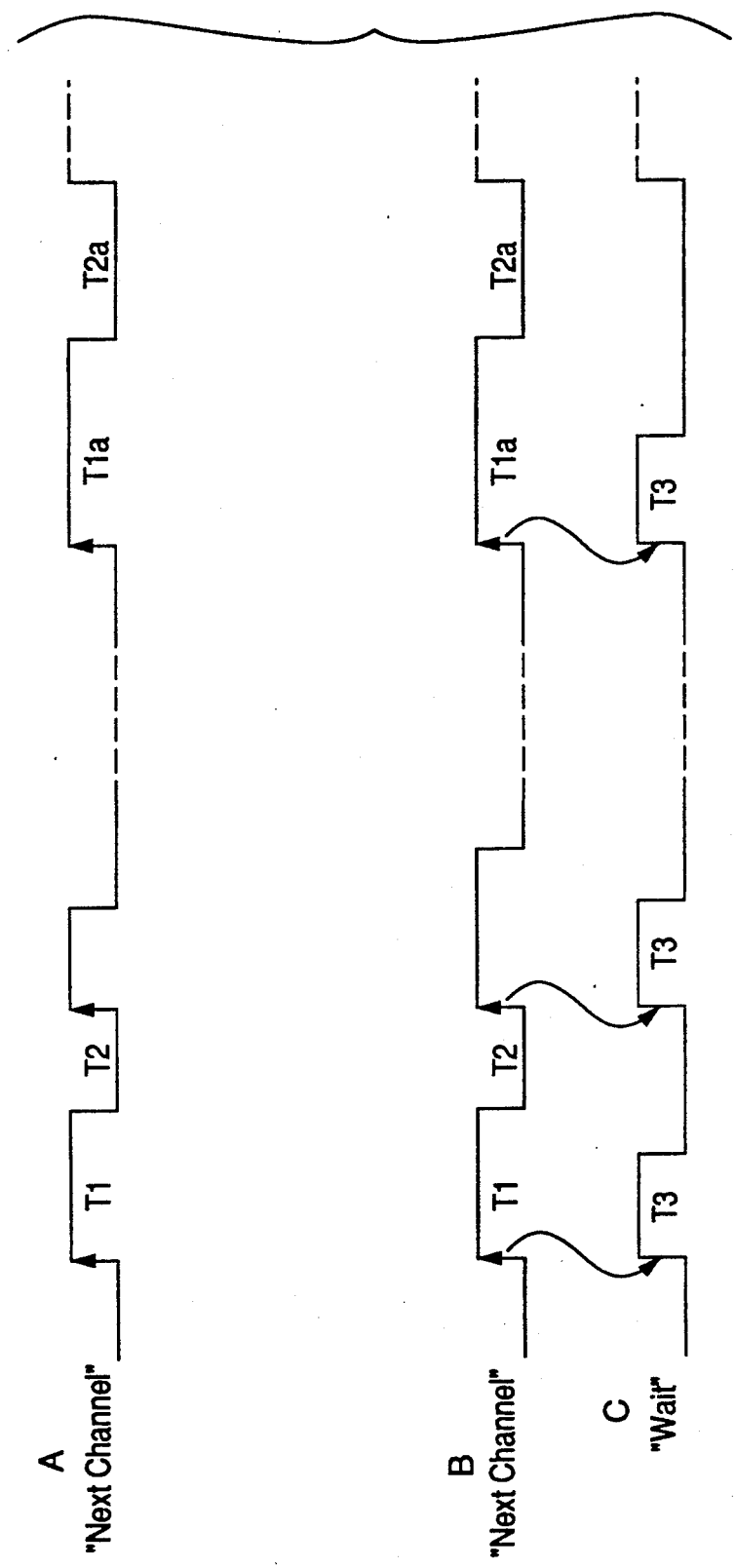
FIG. 16, FIG. 17 and FIG. 18 show, respectively, timing diagrams as an aid in describing the operation of the tester of the present invention.

FIG. 16 includes three timing diagrams to illustrate the operation of the sequential access test that is described above. The timing diagram A. illustrates the effect of the Rate Control on the "Next Channel" output voltage signal from terminal 3 of the timer 55, FIG. 11, as the Rate Control adjustment is moved from its minimum channel access rate to its maximum.

The timing diagram B illustrates the effect between this same voltage signal output from the terminal 3 of the timer 55, FIG. 11, which is input also to the one-shot multivibrator 54 at its terminal 4, and the "Wait" output at the terminal 56. By the timing diagram C., it is shown that the "Wait" output voltage signal is approximately a constant pulse rate of about 1 millisecond even though the "Next Channel" output voltage signal is variable.

Figure 17:
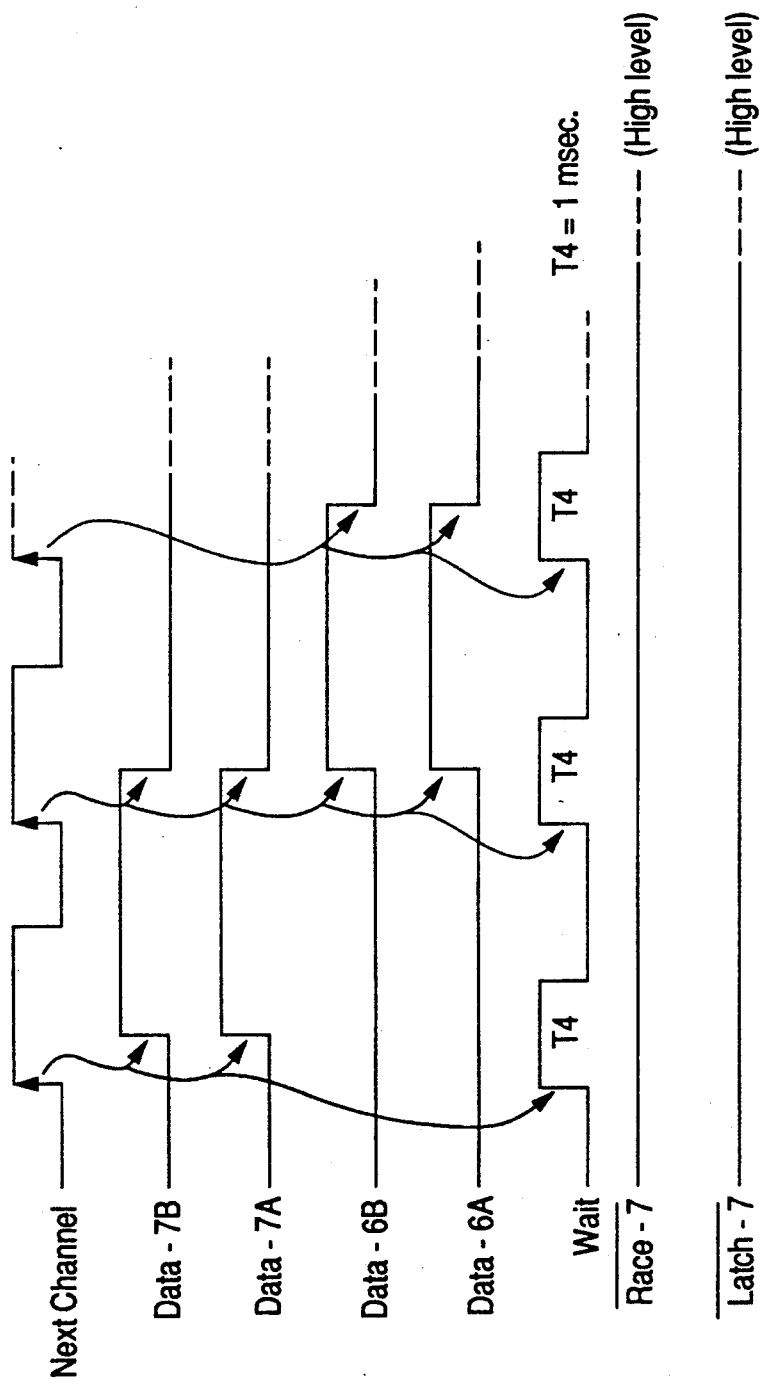

FIG. 17 illustrates by use of several timing diagrams the relationship between data voltage signals in two channels, 6 and 7, the "Next Channel" voltage signals and the "Wait" voltage signal for a NORMAL operation. Note that the sequence of the data signals is shown in reverse order.

Figure 18:
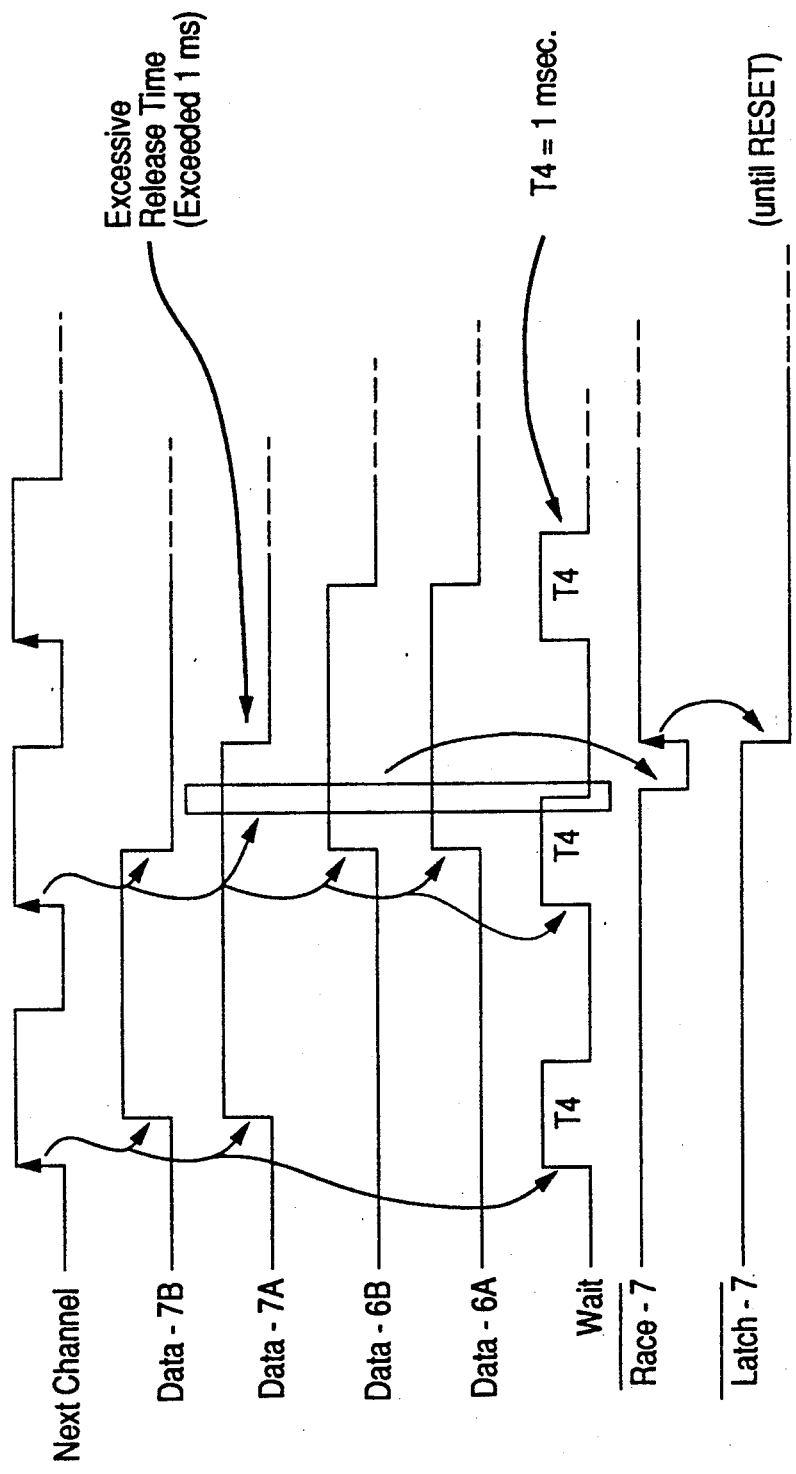

FIG. 18 illustrates the effect of a "Race Condition" by means of the timing diagrams. A "Race Condition" by the numeral 65 to show that the relay contact release time for one data path in channel 7 is excessive, i.e., exceeds approximately 1 millisecond. Also shown is the inverted "Race-7" pulse and how that condition is "Latched" by the change in the level of the voltage signal for the "Latch-7" signal.

Summary

To obtain a higher level of confidence for the functional integrity of a Reed Relay PCB, it is important to KNOW whether a fault exists or is likely to arise, because such a fault, as identified hereinabove, can remain undetected for an extended period time and can affect the quality of the data. The most dangerous fault is the "Race Condition", that is, the excessive release time of relay contacts through which data flows.

Component deterioration (especially of contacts in reed relays) can remain hidden for indefinite amounts of data acquisition time. Since Reed Relay PCBs are typically used within a "Ramp Scanner" model 128RR data acquisition system as well as in Reed Relay type data acquisition systems marketed by other manufactures, a way to determine the presence of these faults is significant. Even though a component may not be discovered to be out-of-tolerance by presently known and used testing techniques, it can be at fault only intermittently, which does affect the functional integrity of the data handling system and it cannot be foreseen at what point in time it begins to develop a more frequent faulty performance.

The tester 10 of the present invention permits an operator with minimal training to test Reed Relay PCBs accurately and consistently to determine their functional integrity and to identify even intermittently faulty parts. Within 10 minutes, a non-extended test of a Reed Relay PCB can be completed, without ever connecting it to a "Ramp Scanner" mainframe, and an extended test of about 30 minutes can be made by the same operator without even being present during the whole test period, since the failures are "Latched" until "Reset".

Having described the present invention completely in substantial detail with reference to the preferred embodiment, it will be apparent to those skilled in this art that modifications and changes can be made, but it is understood that all such modifications and changes that come within the spirit and scope of the claims appended hereto are within the present invention.

What is claimed is:

1. A tester for determining the operational performance of a Reed Relay Printed Circuit Board in a data acquisition system, comprising:

a Reed Relay Printed Circuit Board, comprising input and output terminals, a plurality of data flow paths and a plurality of contacts, said Reed Relay Printed Circuit Board Being used in conjunction with a ramp scanner data acquisition system;

means for providing accurate input voltages to said Reed Relay Printed Circuit Board;

first connector means for electrically connecting said voltages to said Reed Relay Printed Circuit Board;

second connector means for electrically connecting an output voltage signal from said output terminals of said Reed Relay Printed Circuit Board to said tester;

means in said tester for connecting said input voltages repeatedly in sequence to each of said plurality of data flow paths;

circuit means for accessing one data flow path for accurately determining whether relay contacts in said data flow path open as relay contacts in a next data flow path in said sequence are closed and for determining the contact release time of the relay contacts in said data flow path, including:

indicator means to indicate, when energized, whether any relay contact fails to open as the next contact closes; and logic circuitry for maintaining said indicator means energized until reset manually;

whereby said tester is effective to give an indication of a relay contact failure condition even when said tester is unattended, said failure condition being defined by a release time of at least 10 times a specified release time for said contact, said specified release time for said contact being approximately 100 microseconds and said failure condition being a release time of at least 1 millisecond.

2. A tester as defined in claim 1 including second circuit means for accessing in sequence each of said plurality of data flow paths, in parallel with said first-mentioned means for accessing, including indicator means for testing path continuity.

3. A tester as defined in claim 2 wherein each said means for accessing each of said data flow path is adjustable for controlling a rate of access.

4. A tester as defined in claim 3 wherein said adjustable means for controlling said rate of access for each of said data flow paths is from about 1 channel per second to about 8 channels per second, where each channel includes two data flow paths.

5. A tester as defined in claim 4 including at least two edge-type connector means for providing said input connection means to a Reed Relay Printed Circuit Board and spade lug attachment means for providing said output connection means.

6. A tester as defined in claim 5 including test probe means having indicator means connected in series to indicate a predetermined circuit condition for any of said plurality of data flow paths.

7. A tester as defined in claim 6 including a plurality of printed circuit board address selector switches for setting to match address selection switches on any reel relay printed circuit board to be tested in order to conform the tester sequence of accessing for said data flow paths to the path sequence in a test board.

8. A tester as defined in claim 7 wherein said rate of sequencing of data flow paths includes circuit means having timer, binary counter and monostable multivibrator components.

9. A tester ad defined in claim 8 wherein said indicator means includes light emitting diodes for a visual indication of Reed Relay Printed Circuit Board performance and data flow path condition.

* * * * *